(12) United States Patent
Orimoto

(10) Patent No.: US 8,653,643 B2
(45) Date of Patent: Feb. 18, 2014

(54) SEMICONDUCTOR MODULE

(71) Applicant: Norimune Orimoto, Toyota (JP)

(72) Inventor: Norimune Orimoto, Toyota (JP)

(73) Assignee: Toyota Jidosha Kabushiki Kaisha, Toyota-Shi (JP)

(*) Notice: Subject to any disclaimer, the term of this patent is extended or adjusted under 35 U.S.C. 154(b) by 0 days.

(21) Appl. No.: 13/773,443

(22) Filed: Feb. 21, 2013

(65) Prior Publication Data

US 2013/0214404 A1   Aug. 22, 2013

(30) Foreign Application Priority Data

Feb. 22, 2012   (JP) .................................. 2012-036737

(51) Int. Cl.
*H01L 23/48* (2006.01)

(52) U.S. Cl.
USPC .......................................... 257/688; 257/678

(58) Field of Classification Search
USPC .................. 257/678, 687, 688, 690, 704, 735
See application file for complete search history.

(56) References Cited

U.S. PATENT DOCUMENTS

| | | | |
|---|---|---|---|
| 6,845,012 B2* | 1/2005 | Ohkouchi | 361/704 |
| 2005/0040515 A1* | 2/2005 | Inoue et al. | 257/706 |
| 2013/0062749 A1* | 3/2013 | Imai | 257/690 |
| 2013/0168845 A1* | 7/2013 | Aoshima | 257/712 |

FOREIGN PATENT DOCUMENTS

| | | |
|---|---|---|
| JP | 09-252067 A | 9/1997 |
| WO | 2013038493 A1 | 3/2013 |
| WO | 2013054416 A1 | 4/2013 |

\* cited by examiner

*Primary Examiner* — S. V. Clark
(74) *Attorney, Agent, or Firm* — Kenyon & Kenyon LLP

(57) ABSTRACT

A semiconductor module includes a semiconductor element, a case member, a cylindrical body, a lid member, a bus bar, and an insulating plate. The case member includes a bottom member and an extended portion. Eight protruding portions are formed on an outer peripheral surface of the cylindrical body. Eight recessed portions are formed on an inner surface of a central hole of the bus bar. The cylindrical body is inserted into the central hole of the bus bar. The protruding portions of the cylindrical body are engaged with the recessed portions of the bus bar. A direction in which an extended portion of the bus bar extends is fixed in one direction, from among a plurality of directions in a circumferential direction of the cylindrical body, by engagement of the protruding portions with the recessed portions.

4 Claims, 7 Drawing Sheets

SEMICONDUCTOR MODULE

INCORPORATION BY REFERENCE

The disclosure of Japanese Patent Application No. 2012-036737 filed on Feb. 22, 2012 including the specification, drawings and abstract is incorporated herein by reference in its entirety.

BACKGROUND OF THE INVENTION

1. Field of the Invention

The invention relates to a semiconductor module.

2. Description of Related Art

When a semiconductor element generates heat, the semiconductor element and members there around (solder and wiring and the like) thermally expand. Stress is applied to the semiconductor element due to a difference in the thermal expansion rates (i.e., the coefficient of thermal expansion) of the members. Such stress shortens the life of the semiconductor element. In order to reduce this kind of stress, connecting a semiconductor element to wiring without using joining by brazing filler metal such as solder is being examined. For example, Japanese Patent Application Publication No. 9-252067 (JP 9-252067 A) describes a semiconductor module in which a semiconductor element is stacked together with electrode plates, and the semiconductor element is connected to the electrode plates by the semiconductor element and the electrode plates being pressing together.

With this kind of semiconductor module, a positive electrode plate is arranged on a lower surface of the semiconductor module, and a negative electrode plate is arranged on an upper surface of the semiconductor module. Therefore, when mounting this semiconductor module to an apparatus, wiring must be connected to both the upper surface side (i.e., the negative electrode plate side) of the semiconductor module, and the lower surface side (i.e., the positive electrode plate side) of the semiconductor module. However, depending on the mounting environment of the semiconductor module, it may be difficult to ensure space to pull the wiring out, on the upper surface side and/or the lower surface side of the semiconductor module. Therefore, technology that enables the pull-out direction of the wiring to be adjusted according to the mounting environment is desirable.

SUMMARY OF THE INVENTION

The invention thus provides a semiconductor module in which the pull-out direction of wiring is able to be adjusted according to the mounting environment.

One aspect of the invention relates to a semiconductor module that includes a first semiconductor element that has a first front surface electrode on a front surface and has a first back surface electrode on a back surface; a first bottom member that is contacting the first back surface electrode; a first cylindrical body that is formed by an insulating body, is formed in a cylindrical shape, surrounds the first semiconductor element, is fixed to the first bottom member, and in which a first screw groove is formed on an outer peripheral surface or an inner peripheral surface; a lid member that is formed by an electric conductor, is contacting the first front surface electrode, and has a second screw groove that engages with the first screw groove; a first conducting member that is formed by an electric conductor, has a first through-hole into which the first cylindrical body is inserted and a first extended portion that extends outward from an outer peripheral surface of the first cylindrical body, is provided outside of the first cylindrical body, and is contacting the lid member; a second conducting member that is formed by an electric conductor, is provided outside of the first cylindrical body, and is contacting the first bottom member; and a first insulating member that insulates between the first conducting member and the second conducting member, wherein the lid member is fixed to the first cylindrical body by engagement of the second screw groove with the first screw groove; the first conducting member is fixed with respect to the lid member and the first bottom member, by being sandwiched between the lid member and the first bottom member that are fixed to the first cylindrical body; the first semiconductor element is fixed with respect to the lid member and the first bottom member, by being sandwiched between the lid member and the first bottom member; a first protruding portion is formed on one of the outer peripheral surface of the first cylindrical body and an inner surface of the first through-hole, a first recessed portion that is able to engage with the first protruding portion is formed on the other of the outer peripheral surface of the first cylindrical body and the inner surface of the first through-hole, and when the first cylindrical body is inserted into the first through-hole, the first protruding portion and the first recessed portion engage, such that the first conducting member is positioned with respect to the first cylindrical body; a plurality of positioning positions of the first conducting member with respect to the first cylindrical body are provided in a circumferential direction by the first protruding portion being formed in at least one location in the circumferential direction, and the first recessed portion being formed in a plurality of locations in the circumferential direction; and the first extended portion extends in one direction, for among a plurality of directions in the circumferential direction of the first cylindrical body, corresponding to the plurality of positioning positions of the first conducting member.

According to the aspect of the invention, the pull-out direction of the wiring is able to be adjusted according to the mounting environment and the like.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
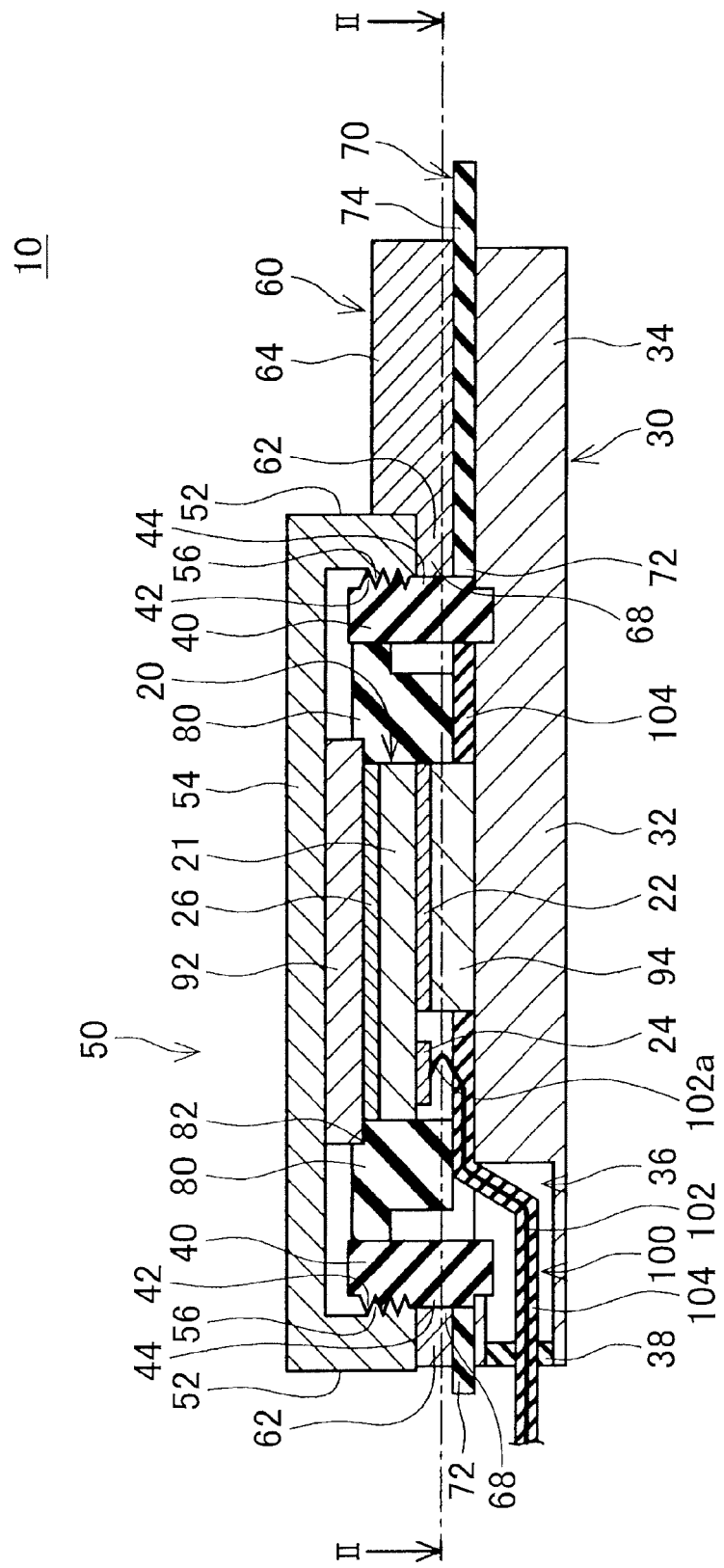
FIG. 1 is a sectional view schematically showing a semiconductor module according to a first example embodiment of the invention.

Hereinafter, the main characteristics of the example embodiments described below will be listed.

A second conducting member may have a second through-hole into which a first cylindrical body is inserted, and a second extended portion that extends outward from an outer peripheral surface of the first cylindrical body. A second protruding portion may be formed on one of the outer peripheral surface of the first cylindrical body and an inner surface of the second through-hole. A second recessed portion that is able to engage with the second protruding portion may be formed on the other of the outer peripheral surface of the first cylindrical body and the inner surface of the second through-hole. When the first cylindrical body is inserted into the second through-hole, the second protruding portion may engage with the second recessed portion, such that the second conducting member is positioned with respect to the first cylindrical body. A plurality of positioning positions of the second conducting member with respect to the first cylindrical body may be provided in a circumferential direction by the second protruding portion being formed in at least one location in the circumferential direction, and the second recessed portion being formed in a plurality of locations in the circumferential direction. The second extended portion may extend in one direction, from among a plurality of directions in the circumferential direction of the first cylindrical body, corresponding to the plurality of positioning positions of the second conducting member. According to this structure, the direction in which the second extended portion of the second conducting member, as well as the first extended portion of the first conducting member, extends is also able to be adjusted in the circumferential direction of the first cylindrical body. Therefore, in addition to the first extended portion, the second extended portion is also able to be arranged extending toward a direction in which wiring is easily able to be provided. Therefore, with this semiconductor module, the pull-out direction of the wiring is more easily able to be adjusted.

A second semiconductor element, a second bottom member, a second cylindrical body, a third conducting member, and a second insulating member may also be provided. The second semiconductor element may have a second front surface electrode on a front surface, and have a second back surface electrode on a back surface. The second bottom member may be connected to the second back surface electrode. The second cylindrical body may be formed by an insulated body, surround the second semiconductor element, and be fixed to one of the second bottom member and the first bottom member. The third conducting member may be formed by an electric conductor, be provided outside of the second cylindrical body, and be connected to the second bottom member. The second insulating member may insulate between the third conducting member and the first bottom member. The second front surface electrode may be connected to a surface of the first bottom member, which is on a side opposite a surface that is contacting the first back surface electrode. The third conducting member may be fixed with respect to the first bottom member and the second bottom member, by being sandwiched between the first bottom member and the second bottom member. The second semiconductor element may be fixed with respect to the first bottom member and the second bottom member, by being sandwiched between the first bottom member and the second bottom member. According to this structure, the first semiconductor element and the second semiconductor element are able to be provided stacked inside of a single semiconductor module.

In another example embodiment described in this specification, a protruding portion and a recessed portion do not have to be provided in a plurality of locations on the outer peripheral surface of the first cylindrical body and the inner surface of the first through-hole. That is, the first conducting member and/or the second conducting member may be rotatable with respect to the first cylindrical body. According to this kind of structure, the direction in which the extended portion of the conducting member extends is able to be adjusted to an appropriate direction in the circumferential direction of the first cylindrical body.

First Example Embodiment

A semiconductor module 10 shown in FIG. 1 includes a semiconductor element 20, a case member 30, a cylindrical body 40, a lid member 50, a bus bar 60, and an insulating plate 70. The semiconductor module 10 is formed with the semiconductor element 20 housed inside of the case member 30, the cylindrical body 40, and the lid member 50.

The semiconductor element 20 is a vertical MOSFET. As shown in FIG. 1, the semiconductor element 20 has a semiconductor substrate 21 made of SiC. A source electrode 22, and a plurality of gate electrode pads 24 are provided on a lower surface of the semiconductor substrate 21. A drain electrode 26 is provided on an upper surface of the semiconductor substrate 21. The semiconductor substrate 21 is formed in a rectangle. The plurality of gate electrode pads 24 are aligned along one side of the semiconductor substrate 21.

The case member 30 is made of metal. The case member 30 has a bottom member 32 and an extended portion 34. The bottom member 32 is formed in a disc shape. A through-hole 36 is formed in the bottom member 32. One end of the through-hole 36 opens on an upper surface of the bottom member 32, and the other end of the through-hole 36 opens on a side surface of the bottom member 32. A gate wiring 100 passes through the through-hole 36, as will be described later. The extended portion 34 extends outward from an outer peripheral surface of the bottom member 32. The extended portion 34 is formed in a rectangle. The bottom member 32 and the extended portion 34 are formed having the same thickness.

Figure 2:
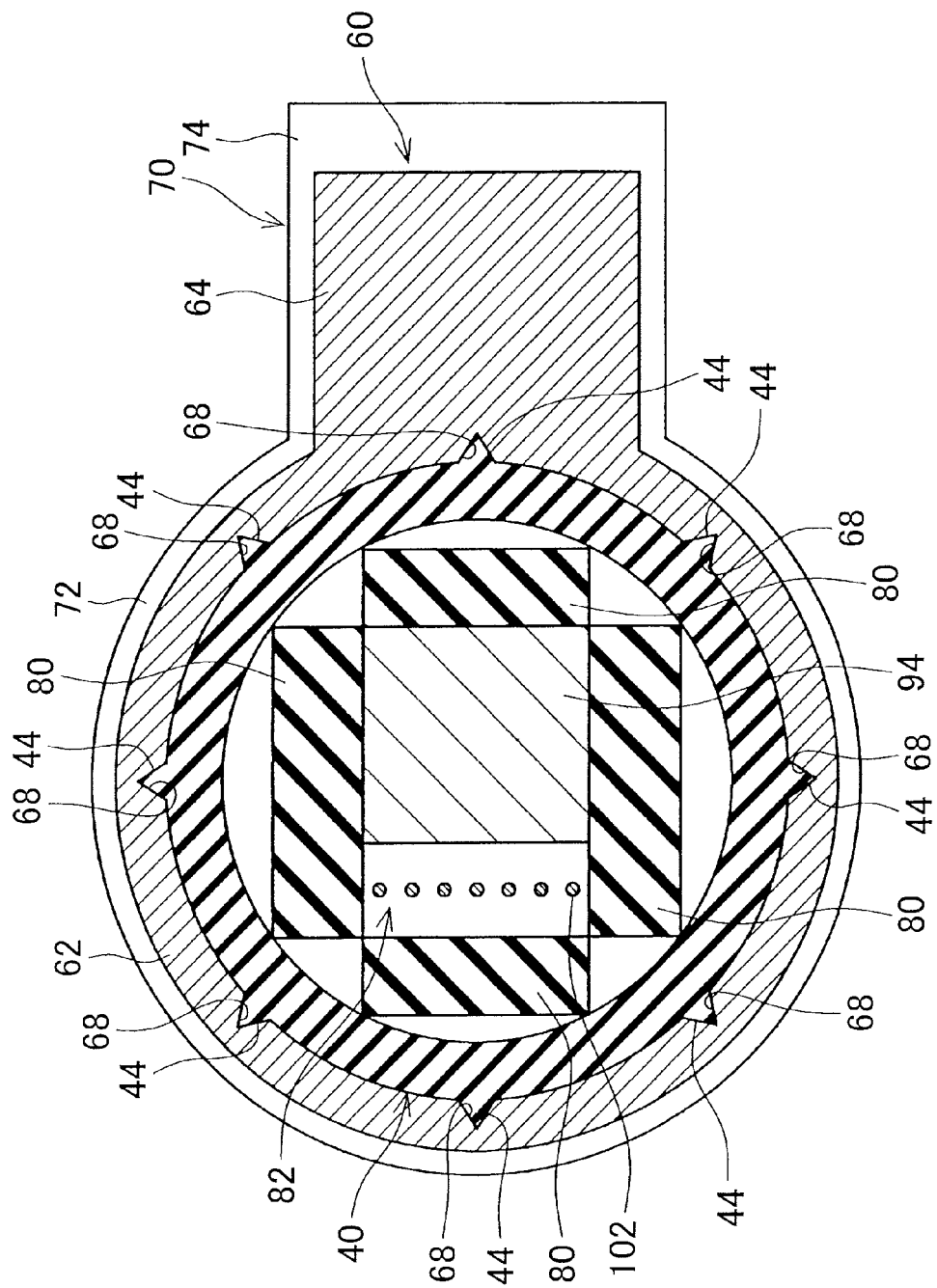
FIG. 2 is a sectional view corresponding to line II-II in FIG. 1.

The cylindrical body 40 is made of high-strength engineering plastic such as phenol resin. A lower end portion of the cylindrical body 40 is fixed embedded in the bottom member 32 of the case member 30. That is, the cylindrical body 40 is a round cylindrical body with a central axis that extends perpendicular to the bottom member 32. A screw groove 42 is formed in an outer peripheral surface near an upper end portion of the cylindrical body 40. A protruding portion 44 is formed below the screw groove 42. As shown in FIG. 2, in this example embodiment, eight of the protruding portions 44 are formed at equally-spaced intervals in a circumferential direction on an outer peripheral surface of the cylindrical body 40. As shown in FIG. 1, the protruding portions 44 extend in an axial direction of the cylindrical body 40. An upper end of each of the protruding portions 44 reaches to near a lower end of the screw groove 42. The lower end of each of the protruding portions 44 reaches the upper surface of the bottom member 32.

A metal plate 94, the semiconductor element 20, a metal plate 92, and a retaining member 80 are arranged inside the cylindrical body 40, on the bottom member 32. Also, the gate wiring 100 passes through the through-hole 36 of the bottom member 32.

The metal plate 94 is arranged on the bottom member 32. The metal plate 94 is made of relatively soft metal such as tin.

The semiconductor element 20 is arranged on the metal plate 94. The semiconductor element 20 is arranged such that the source electrode 22 contacts the metal plate 94. The gate electrode pads 24 are not connected to the metal plate 94.

The metal plate 92 is arranged on the semiconductor element 20. The metal plate 92 is made of relatively soft metal such as tin. The metal plate 92 contacts the drain electrode 26 of the semiconductor element 20.

The gate wiring 100 passes through the through-hole 36 of the bottom member 32. The gate wiring 100 in the through-hole 36 is fixed by an insulating member 38. The gate wiring 100 includes a plurality of metal pins 102, and an insulating member 104 that covers the pins 102. A portion of the insulating member 104 is inside of the cylindrical body 40, and is arranged around the metal plate 94. The plurality of pins 102 are provided in positions opposing the plurality of gate electrode pads 24. One end of each pin 102 is pulled to the outside of the bottom member 32. The other end of each pin 102 protrudes outward from the insulating member 104, and is connected to a corresponding gate electrode pad 24. The end portion of each pin 102 that protrudes outward from the insulating member 104 is a spring portion 102a that elastically deforms. Each spring portion 102a is connected to a corresponding gate electrode pad 24, in a curved state. The pins 102 are insulated from the bottom member 32 by the insulating member 104 that covers the pins 102.

The retaining member 80 is made of high-strength engineering plastic such as phenol resin. The retaining member 80 is arranged between an inner peripheral surface of the cylindrical body 40, and the metal plate 94, the semiconductor element 20, the metal plate 92 that are arranged stacked inside the cylindrical body 40 (hereinafter, the metal plate 94, the semiconductor element 20, the metal plate 92 may also referred to as a "stacked body"). At least a portion of the outer peripheral surface of the retaining member 80 is fixed to the inner peripheral surface of the cylindrical body 40. The retaining member 80 has a positioning space 82 on the inside for positioning the stacked body. The positioning space 82 is formed in a shape matching the shapes of the metal plate 94, the semiconductor element 20, and the metal plate 92 that are arranged. The stacked body is able to be arranged positioned in the cylindrical body 40 by arranging the stacked body stacked in the positioning space 82.

The lid member 50 is made of metal. The lid member 50 includes a round cylindrical side wall portion 52, and a flat plate portion 54 that blocks off an open portion on an upper side of this side wall portion 52. That is, the lid member 50 has a cup shape. A screw groove 56 is formed on an inner peripheral surface of the side wall portion 52. The screw groove 56 of the lid member 50 engages with the screw groove 42 of the cylindrical body 40. That is, the lid member 50 engages with the cylindrical body 40, using the screw grooves 42 and 56. A lower surface of the flat plate portion 54 of the lid member 50 contacts the metal plate 92. That is, the stacked body formed by the metal plate 94, the semiconductor element 20, and the metal plate 92 is sandwiched by the flat plate portion 54 of the lid member 50, and the bottom member 32. The lid member 50 is fastened to the cylindrical body 40. As a result, the stacked body is pressed on by the flat plate portion 54 and the bottom member 32. The members that make up the stacked body are fixed by this pressure. The fastening torque of the lid member 50 may be set as appropriate according to the pressure necessary to fix the stacked body. The contact portion between the bottom member 32 and the metal plate 94, the contact portion between the metal plate 94 and the source electrode 22 of the semiconductor element 20, the contact portion between the drain electrode 26 of the semiconductor element 20 and the metal plate 92, the contact portion between the metal plate 92 and the flat plate portion 54 of the lid member 50, and the contact portion between the pins 102 and the gate electrode pads 24 of the semiconductor element 20 are not joined by brazing filler metal such as solder. Therefore, when the lid member 50 is removed from the cylindrical body 40, the members of the stacked body are able to be separated from each other.

Also, the semiconductor module 10 has a bus bar 60 and an insulating plate 70. The bus bar 60 is made of metal. The bus bar 60 includes a ring portion 62, and an extended portion 64 that is drawn outward from the ring portion 62. The ring portion 62 is thinner than the extended portion 64. As shown in FIG. 2, eight recessed portions 68 are formed at equally-spaced intervals in a circumferential direction of an inner peripheral surface of a central hole of the ring portion 62, on an inner surface of the central hole. As shown in FIG. 1, the recessed portions 68 are formed extending in the axial direction of the ring portion 62, from an upper surface to a lower surface of the ring portion 62. The cylindrical body 40 is inserted into the central hole of the ring portion 62. The protruding portions 44 of the cylindrical body 40 are engaged with the eight recessed portions 68 of the ring portion 62. In this example embodiment, the extended portion 64 extends parallel to the extended portion 34 of the case member 30.

The insulating plate 70 also has a shape generally similar to that of the bus bar 60. The insulating plate 70 is formed by an insulator, and has a ring portion 72, and an extended portion 74 that is drawn outward from the ring portion 72. As shown in FIG. 2, an outer diameter of the ring portion 72 is larger than an outer diameter of the ring portion 62 of the bus bar 60. An inner diameter of a central hole of the ring portion 72 is the same as the inner diameter of the central hole of the ring portion 62 of the bus bar 60. Also, the extended portion 74 is also formed wider than the extended portion 64 of the bus bar 60. Although not shown in detail in FIG. 2, eight recessed portions similar to the recessed portions 68 of the bus bar 60 are also formed on an inner surface of the central hole of the ring portion 72. These recessed portions are also formed extending in the axial direction of the ring portion 72, from an upper surface to a lower surface of the ring portion 72. The cylindrical body 40 is inserted into the central hole of the ring portion 72. The protruding portions 44 of the cylindrical body 40 are engaged with the eight recessed portions of the ring portion 72. In this example embodiment, the extended portion 74 extends parallel to the extended portion 34 of the case member 30. In this example embodiment, as shown in FIG. 1, the insulating plate 70 is arranged on the bottom member 32 and the extended portion 34 of the case member 30, and the bus bar 60 is arranged on the insulating plate 70. The insulating plate 70 is formed thick enough to be able to electrically insulate the bus bar 60 and the case member 30.

The upper surface of the ring portion 62 of the bus bar 60 contacts the lower end of the side wall portion 52 of the lid member 50. The lower surface of the ring portion 62 contacts the ring portion 72 of the insulating plate 70. The ring portion 62 of the bus bar 60 and the ring portion 72 of the insulating plate 70 are vertically sandwiched by the lid member 50 and the bottom member 32. As described above, the lid member 50 is fastened to the cylindrical body 40. Therefore, the ring portion 62 of the bus bar 60 and the ring portion 72 of the insulating plate 70 are pressed on by the lid member 50 and the bottom member 32. The bus bar 60 and the insulating plate 70 are fixed with respect to the lid member 50 and the bottom member 32 by this pressure. As a result, the bus bar 60 is electrically connected to the lid member 50, and electrically insulated from the case member 30. The fastening torque of the lid member 50 may be set as appropriate according to the pressure necessary to fix the bus bar 60 and the insulating plate 70. Accordingly, when the lid member 50 is removed from the cylindrical body 40, the bus bar 60 and the insulating plate 70 are able to be separated from the cylindrical body 40. Therefore, the engagement position of the recessed portions 68 of the bus bar 60 and the protruding portions 44 of the cylindrical body 40 is also able to be changed. In this case, the extended portion 64 of the bus bar 60 is able to be extended in a different direction than that shown in FIGS. 1 and 2.

With the semiconductor module 10 in this example embodiment, the drain electrode 26 of the semiconductor element 20 is electrically connected to the lid member 50 via the metal plate 92. Also, the lower end of the side wall portion 52 of the lid member 50 is electrically connected to the ring portion 62 of the bus bar 60 by pressure. That is, the bus bar 60 is electrically connected to the drain electrode 26. Also, the source electrode 22 of the semiconductor element 20 is electrically connected to the case member 30 via the metal plate 94.

Next, a manufacturing method of the semiconductor module 10 in FIG. 1 will be described. First, the case member 30 in which the cylindrical body 40 is fixed to the upper surface is prepared. Next, a component in which the semiconductor module 10 and the insulating member 38 have been integrated is arranged in the through-hole 36 of the bottom member 32. In another example, the gate wiring 100 and the insulating member 38 may be formed individually. In this case, the insulating member 38 may also be formed by solidifying clay or liquid insulating material. Next, the retaining member 80 is inserted into the cylindrical body 40 and fixed there. Then the metal plate 94 is placed on the bottom member 32 in the cylindrical body 40 (i.e., in the retaining member 80). Then the semiconductor element 20 is placed on the metal plate 94. At this time, the source electrode 22 contacts the metal plate 94, and the gate electrode pads 24 contact the corresponding spring portions 102a of the pins 102. Next, the metal plate 92 is placed on the semiconductor element 20.

Next, the cylindrical body 40 is passed through the central hole of the insulating plate 70, and the insulating plate 70 is arranged such that the ring portion 72 of the insulating plate 70 is arranged on the bottom member 32. At this time, the recessed portions on the inner peripheral surface of the ring portion 72 of the insulating plate 70 are engaged with the protruding portions 44 of the cylindrical body 40. At this time, as shown in FIG. 1, the insulating plate 70 is arranged such that the extended portion 74 thereof extends toward the right in FIG. 1 (hereinafter, this direction will be referred to as the "predetermined direction").

Continuing on, the cylindrical body 40 is passed through the central hole of the bus bar 60, and the bus bar 60 is arranged such that the ring portion 62 of the bus bar 60 is arranged on the ring portion 72 of the insulating plate 70. In this case as well, the recessed portions 68 on the inner peripheral surface of the ring portion 62 of the bus bar 60 are engaged with the protruding portions 44 of the cylindrical body 40. At this time, as shown in FIG. 1, the bus bar 60 is arranged such that the extended portion 64 thereof extends toward the predetermined direction described above.

Next, the lid member 50 is fixed to the cylindrical body 40 by engaging the screw groove 56 of the lid member 50 with the screw groove 42 of the cylindrical body 40. When the lid member 50 is moved downward by rotating the lid member 50 around its central axis, the flat plate portion 54 of the lid member 50 contacts the metal plate 92. Also, the lower end of the side wall portion 52 of the lid member 50 contacts the ring portion 62 of the bus bar 60. When the lid member 50 is rotated from there, the flat plate portion 54 of the lid member 50 presses the metal plate 92 toward the semiconductor element 20. That is, the stacked body (i.e., the metal plate 94, the semiconductor element 20, and the metal plate 92) that is sandwiched by the flat plate portion 54 of the lid member 50 and the bottom member 32 is pressed in the stacking direction thereof. As a result, the members of the stacked body are fixed with respect to the bottom member 32 and the lid member 50. At the same time, the side wall portion 52 of the lid member 50 presses the ring portion 62 of the bus bar 60 and the ring portion 72 of the insulating plate 70 toward the bottom member 32. That is, the ring portions 62 and 72 that are sandwiched by the side wall portion 52 and the bottom member 32 are pressed on. Accordingly, the bus bar 60 and the insulating plate 70 are fixed with respect to the bottom member 32 and the lid member 50. At this time, the bus bar 60 is electrically connected to the lid member 50, and electrically insulated from the case member 30. As described above, the recessed portions 68 of the bus bar 60 and the recessed portions of the insulating plate 70 are engaged with the protruding portions 44 of the cylindrical body 40. Therefore, the bus bar 60 and the insulating plate 70 will not end up rotating with the rotation of the lid member 50 when the lid member 50 is fastened to the cylindrical body 40.

The metal plate 94 is softer than the source electrode 22 and the bottom member 32 that are adjacent thereto. Therefore, when the stacked body is pressed on, the metal plate 94 plastic deforms, such that the metal plate 94 closely contacts both the source electrode 22 and the bottom member 32. Accordingly, the source electrode 22 is electrically connected to the bottom member 32. Similarly, the metal plate 92 is softer than the drain electrode 26 and the lid member 50 that are adjacent thereto. Therefore, when the stacked body is pressed on, the metal plate 92 plastic deforms, such that the metal plate 92 closely contacts both the drain electrode 26 and the lid member 50. Accordingly, the drain electrode 26 is electrically connected to the lid member 50.

Also, when the stacked body is pressed on, the spring portions 102a of the pins 102 deform. As a result, suitable pressure is applied between the pins 102 and the gate electrode pads 24, such that the pins 102 are electrically connected to the gate electrode pads 24. This completes the semiconductor module 10 shown in FIG. 1.

Heretofore, the structure and manufacturing method of the semiconductor module 10 according to this example embodiment are described. With the semiconductor module 10 of this example embodiment, the semiconductor element 20 is fixed by pressure, and the semiconductor element 20 is not joined to the surrounding members by brazing or the like. Therefore, stress will not easily be applied to the semiconductor element 20 when the semiconductor element 20 and members therearound thermally expand as a result of the semiconductor element 20 generating heat. Thus, the life of this semiconductor module 10 is long.

Also, with the semiconductor module 10 of this example embodiment, when the lid member 50 is removed from the cylindrical body 40, the bus bar 60 and the insulating plate 70 are able to be separated from the cylindrical body 40. Accordingly, the engagement position of the recessed portions 68 of the bus bar 60 and the protruding portions 44 of the cylindrical body 40 is also able to be changed. Changing the engagement position of the recessed portions 68 and the protruding portions 44 enables the extended portion 64 of the bus bar 60 to be extended in a different direction than that shown in FIGS. 1 and 2. That is, the direction in which the extended portion 64 of the bus bar 60 extends is able to be adjusted in the circumferential direction of the cylindrical body 40. Therefore, with the semiconductor module 10 of this example embodiment, the extended portion 64 of the bus bar 60 is able to be arranged so as to extend in a direction in which wiring is able to be easily provided. Therefore, with the semiconductor module 10 of this example embodiment, the direction in which the extended portion 64 extends is able to be adjusted according to the mounting environment, which enables wiring to be performed easily so the semiconductor module 10 can be connected to an external device.

Also, the semiconductor element 20 is one example of a first semiconductor element. The bus bar 60 is one example of a first conducting member. The bottom member 32 is one example of a first bottom member. The extended portion 34 is one example of a second conducting member. The insulating plate 70 is one example of a first insulating member. The central hole of the bus bar 60 is one example of a first through-hole. The protruding portions 44 of the cylindrical body 40 is one example of a first protruding portion, and the recessed portions 68 of the bus bar 60 are one example of a first recessed portion.

Second Example Embodiment

Figure 3:
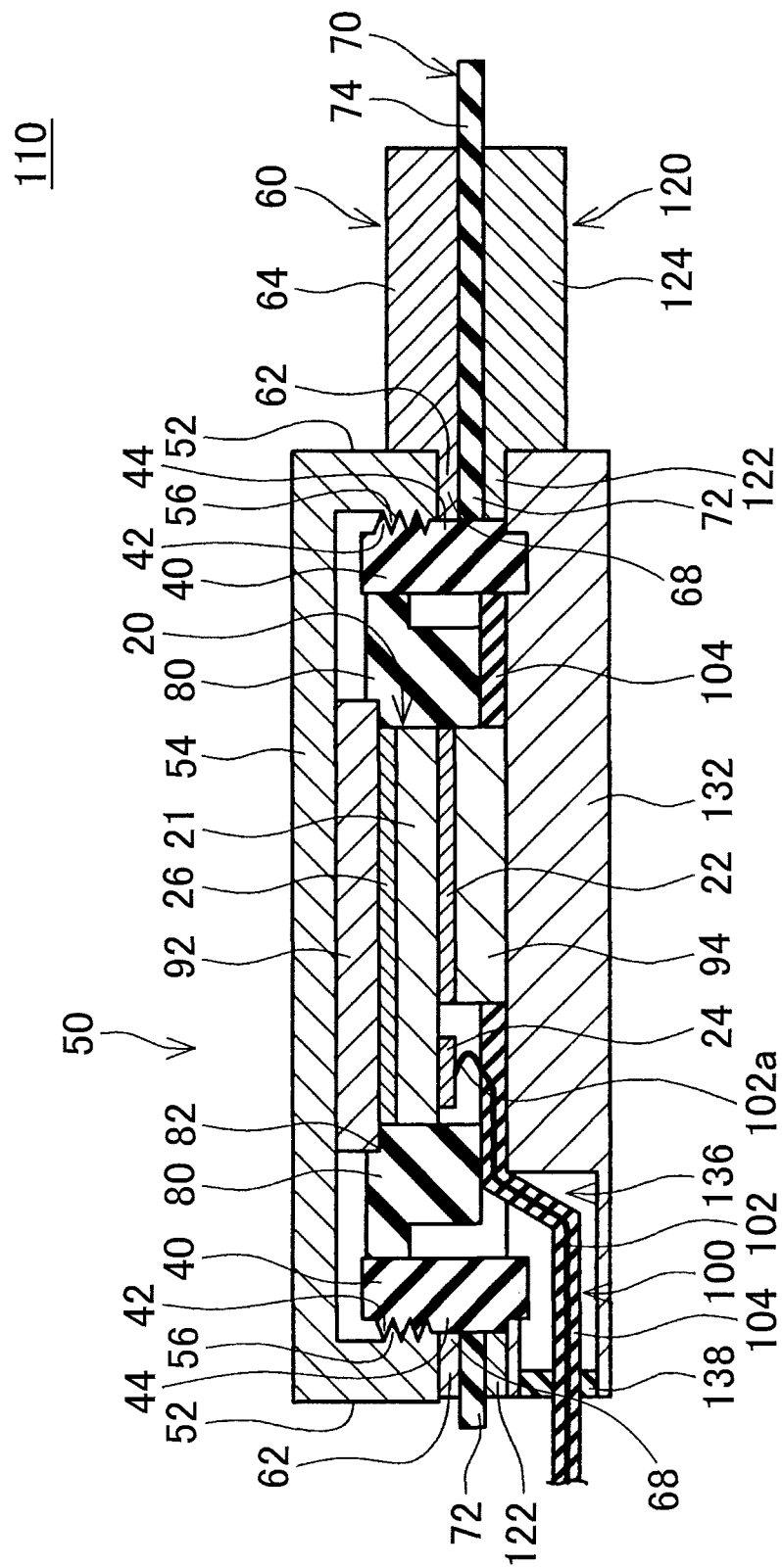
FIG. 3 is a sectional view schematically showing a semiconductor module according to a second example embodiment of the invention.

Next, a semiconductor module 110 according to a second example embodiment, as well as a manufacturing method thereof, will be described with reference to FIG. 3, focusing mainly on those points that differ from the first example embodiment described above. As shown in FIG. 3, the semiconductor module 110 of this example embodiment differs from the semiconductor module 10 of the first example embodiment in that a bottom member 132 and a bus bar 120 are provided individually, instead of in the case member 30 in the first example embodiment (see FIG. 1). In FIG. 3, members having the same structure as in FIG. 1 (e.g., the semiconductor element 20, the cylindrical body 40, the lid member 50, the bus bar 60, the insulating plate 70, the gate wiring 100, and the like) will be denoted by the same reference characters as they are in the first example embodiment.

The bottom member 132 is made of metal, and is formed in a disc shape similar to that of the bottom member 32. A cylindrical body 40 is fixed to an upper surface of the bottom member 132. Also, a through-hole 136 is provided in the bottom member 132, with one end of the through-hole 136 open to the upper surface of the bottom member 132, and the other end of the through-hole 136 open to a side surface of the bottom member 132. A gate wiring 100 is fixed by an insulating member 138 at an open portion of the through-hole 136.

The bus bar 120 is made of metal. The bus bar 120 has a structure similar to that of the bus bar 60. That is, the bus bar 120 includes a ring portion 122, and an extended portion 124 that is drawn outward from the ring portion 122. The ring portion 122 is thinner than the extended portion 124. Although not shown, eight recessed portions are also formed at equally-spaced intervals in a circumferential direction on an inner peripheral surface of a central hole of the ring portion 122. These recessed portions are also formed extending in the axial direction of the ring portion 122, from an upper surface to a lower surface of the ring portion 122. The cylindrical body 40 is inserted into the central hole of the ring portion 122. The protruding portions 44 of the cylindrical body 40 are engaged with the eight recessed portions of the ring portion 122. In this example embodiment, the bus bar 120 is provided between the bottom member 132 and an insulating plate 70. In this example embodiment, as shown in FIG. 3, the extended portion 64 of the bus bar 60, the extended portion 74 of the insulating plate 70, and the extended portion 124 of the bus bar 120 all extend in the same direction (i.e., to the right in FIG. 3).

Next, a manufacturing method of the semiconductor module 110 in FIG. 3 will be described. The manufacturing method of the semiconductor module 110 of this example embodiment is basically the same as that in the first example embodiment. In this example embodiment, however, the bus bar 120 is arranged before arranging the insulating plate 70, which differs from the first example embodiment.

That is, in this example embodiment, once the metal plate 94, the semiconductor element 20, and the metal plate 92 are arranged in order inside the cylindrical body 40, then the cylindrical body 40 is passed through the central hole of the bus bar 120, and the bus bar 120 is arranged such that the ring portion 122 is arranged on the bottom member 132. At this time, the recessed portions on the inner peripheral surface of the ring portion 122 of the bus bar 120 are engaged with the protruding portions 44 of the cylindrical body 40. At this time, as shown in FIG. 3, the bus bar 120 is arranged such that the extended portion 124 thereof extends toward the right side in FIG. 3 (i.e., the predetermined direction).

Next, the cylindrical body 40 is passed through the central hole of the insulating plate 70, and the insulating plate 70 is arranged such that the ring portion 72 of the insulating plate 70 is arranged on the ring portion 122 of the bus bar 120. The arranging method of the insulating plate 70 is the same as it is in the first example embodiment. Then the bus bar 60 is arranged just as in the first example embodiment.

Continuing on, the lid member 50 is fixed to the cylindrical body 40 by engaging the screw groove 56 of the lid member 50 with the screw groove 42 of the cylindrical body 40, just as in the first example embodiment. As a result, the ring portions 62, 72, and 122 are pressed on by the side wall portion 52 and the bottom member 132. Accordingly, the bus bar 60, the insulating plate 70, and the bus bar 120 are fixed with respect to the bottom member 132 and the lid member 50. Thus, the bus bar 60 is electrically connected to the lid member 50, and the bus bar 120 is electrically connected to the bottom member 132, while the bus bar 60 and the bus bar 120 are electrically insulated.

Heretofore, the structure and manufacturing method of the semiconductor module 110 according to this example embodiment are described. The semiconductor module 110 of this example embodiment is also able to display the same effects as those displayed by the semiconductor module 10 of the first example embodiment. Furthermore, with the semiconductor module 110 of this example embodiment, when the lid member 50 is removed from the cylindrical body 40, the bus bar 120, in addition to the bus bar 60 and the insulating plate 70, is also able to be separated from the cylindrical body 40. Therefore, the engagement position of the recessed portions of the bus bar 120 and the protruding portions 44 of the cylindrical body 40 is able to be changed. As a result, the extended portion 124 of the bus bar 120, in addition to the extended portion 64 of the bus bar 60, is able to be extended in a different direction than that shown in FIG. 3. That is, the direction in which the extended portion 124 of the bus bar 120 extends is also able to be adjusted in the circumferential direction of the cylindrical body 40. Therefore, with the semiconductor module 110 of this example embodiment, the extended portion 124 of the bus bar 120, in addition to the extended portion 64 of the bus bar 60, is also able to be arranged extending in a direction in which wiring is easily able to be provided. Therefore, with the semiconductor module 110 of this example embodiment, the directions in which the extended portion 64 and the extended portion 124 extend are able to be adjusted according to the mounting environment, which enables wiring to be performed easily so the semiconductor module 110 can be connected to an external device.

Also, the semiconductor element 20 is one example of a first semiconductor element. The bus bar 60 is one example of a first conducting member. The bottom member 132 is one example of a first bottom member. The bus bar 120 is one example of a second conducting member. The insulating plate 70 is one example of a first insulating member. The central hole of the bus bar 60 is one example of a first through-hole. The protruding portions 44 of the cylindrical body 40 are one example of a first protruding portion, and the recessed portions 68 of the bus bar 60 are one example of a first recessed portion. The central hole of the bus bar 120 is one example of a second through-hole. The protruding portions 44 of the cylindrical body 40 are one example of a second protruding portion, and the recessed portions of the bus bar 120 are one example of a second recessed portion.

Third Example Embodiment

Figure 4:
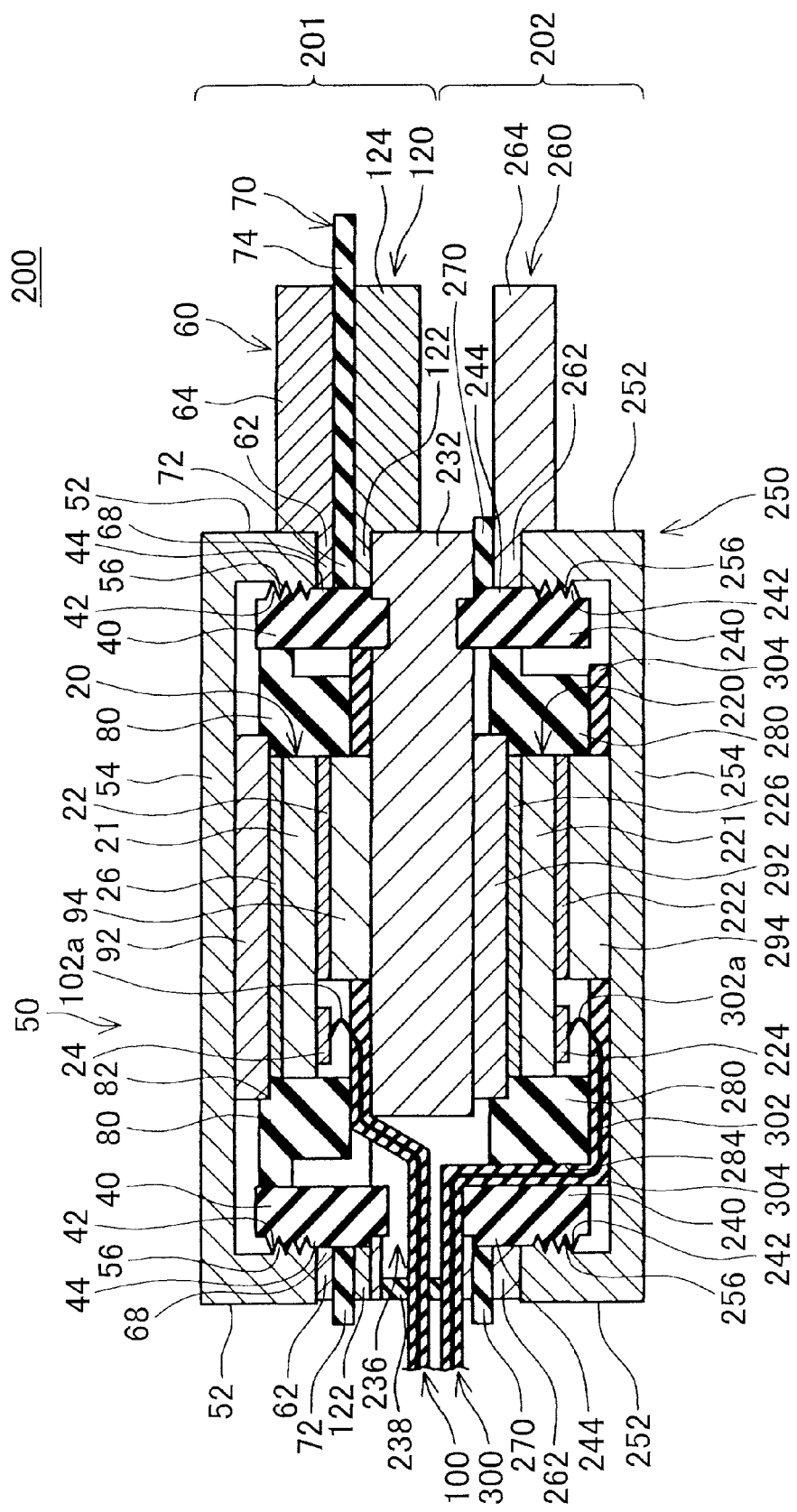
FIG. 4 is a sectional view schematically showing a semiconductor module according to a third example embodiment of the invention.

Next, a semiconductor module 200 according to a third example embodiment, as well as a manufacturing method thereof, will be described with reference to FIG. 4, focusing mainly on those points that differ from the first and second example embodiments described above. As shown in FIG. 4, the semiconductor module 200 of this example embodiment has an upper layer portion 201 that includes a semiconductor element 20, and a lower layer portion 202 that includes a semiconductor element 220. The semiconductor module 200 has a structure that connects the semiconductor element 20 with the semiconductor element 220 in series. The upper layer portion 201 has substantially the same structure as the semiconductor module 110 of the second example embodiment. However, the structure of a bottom member 232 in this example embodiment differs from the second example embodiment.

As shown in FIG. 4, the bottom member 232 is made of metal and formed in a disc shape. A cylindrical body 40 is fixed to an upper surface of the bottom member 232. Also, a cylindrical body 240 that will be described later is fixed to a lower surface of the bottom member 232. A through-hole 236 is provided in the bottom member 232, and opens on the upper surface, the lower surface, and a side surface of the bottom member 232. Gate wirings 100 and 300 are fixed by an insulating member 238 at an open portion formed in the side surface of the bottom member 232.

In this example embodiment, the upper layer portion 201 and the lower layer portion 202 share the bottom member 232. As shown in FIG. 4, the lower layer portion 202 includes a semiconductor element 220, a bottom member 232, a cylindrical body 240, a lid member 250, a bus bar 260, an insulating plate 270, a retaining member 280, metal plates 292 and 294, and a gate wiring 300.

The semiconductor element 220 has a structure similar to that of the semiconductor element 20. That is, the semiconductor element 220 includes a semiconductor substrate 221, a source electrode 222, a plurality of gate electrode pads 224, and a drain electrode 226.

The cylindrical body 240 also has a structure similar to that of the cylindrical body 40. However, an upper end portion of the cylindrical body 240 is fixed embedded in the lower surface of the bottom member 232. A screw groove 242 is formed on an outer peripheral surface near a lower end portion of the cylindrical body 240. Similar to the cylindrical body 40, eight protruding portions 244 are formed at equally-spaced intervals in a circumferential direction on an outer peripheral surface of the cylindrical body 240, above the screw groove 242. The protruding portions 244 extend in the axial direction of the cylindrical body 240. A lower end of each of the protruding portions 244 reaches to near an upper end of the screw groove 242. An upper end of each of the protruding portions 44 reaches to the lower surface of the bottom member 232.

The lid member 250 is made of metal. The lid member 250 has a round cylindrical side wall portion 252, and a flat plate portion 254 that blocks off an open portion on a lower side of the side wall portion 252. That is, the lid member 250 has a cup shape similar to that of the lid member 50. A screw groove 256 is formed on an inner peripheral surface of the side wall portion 252. The screw groove 256 of the lid member 250 engages with the screw groove 242 of the cylindrical body 240. That is, the lid member 250 engages with the cylindrical body 240, using the screw grooves 242 and 256.

As shown in FIG. 4, the metal plate 294, the semiconductor element 220, the metal plate 292, and the retaining member 280 are arranged inside the cylindrical body 240, on the flat plate portion 254 of the lid member 250. Also, the end portion of the gate wiring 300 is also arranged on the flat plate portion 254 of the lid member 250.

The metal plate 294 and the metal plate 292 are similar to the metal plates 94 and 92. The metal plate 294 is arranged on an upper surface of the flat plate portion 254 of the lid member 250. The semiconductor element 220 described above is arranged on the metal plate 294. The semiconductor element 220 is arranged with the source electrode 222 contacting the metal plate 294. The gate electrode pads 224 are not connected to the metal plate 294. The metal plate 292 is arranged on the semiconductor element 220. The metal plate 292 is contacting the drain electrode 226 of the semiconductor element 220.

The lower surface of the bottom member 232 contacts the metal plate 292. That is, a stacked body formed by the metal plate 294, the semiconductor element 220, and the metal plate 292 is sandwiched by the lower surface of the bottom member 32 that is fixed to the cylindrical body 240, and the flat plate portion 254 of the lid member 250.

The gate wiring 300 is passed through the through-hole 236 of the bottom member 232, and a through-hole 284 of the retaining member 280, and arranged inside the cylindrical body 240. The gate wiring 300 has a structure similar to that of the gate wiring 100, and includes a plurality of pins 302, and an insulating member 304. A portion of the insulating member 304 is arranged on the flat plate portion 254 of the lid member 250, and arranged around the metal plate 294. The plurality of pins 302 are provided in positions corresponding to the plurality of gate electrode pads 224. Each of the pins 302 is arranged with one end outside of the through-hole 236. The other end of each of the pins 302 protrudes outward from the insulating member 304, and is connected to a corresponding gate electrode pad 224. The end portion of each pin 302 that protrudes outward from the insulating member 304 is a spring portion 302a that elastically deforms. Each spring portion 302a contacts a corresponding gate electrode pad 224, in a curved state. The pins 302 are insulated from the lid member 250 and the bottom member 232 by the insulating member 304 that covers the pins 302.

The retaining member 280 has a structure substantially similar to that of the retaining member 80. That is, the outer peripheral surface of the retaining member 280 is fixed to the inner peripheral surface of the cylindrical body 240. The retaining member 280 has a positioning space on the inside for positioning the metal plate 294, the semiconductor element 220, and the metal plate 292 (i.e., the stacked body). Also, a through-hole 284 to pass the gate wiring 300 described above through is formed in the retaining member 280. The members of the stacked body are able to be arranged positioned in the cylindrical body 240 by arranging them (i.e., the members of the stacked body) in the positioning space.

The lid member 250 is fastened to the cylindrical body 240. Therefore, the stacked body is pressed on by the lower surface of the bottom member 232 and the flat plate portion 254. The members that make up the stacked body are fixed by this pressure. The contact portion between the flat plate portion 254 of the lid member 250 and the metal plate 294, the contact portion between the metal plate 294 and the source electrode 222 of the semiconductor element 220, the contact portion between the drain electrode 226 of the semiconductor element 220 and the metal plate 292, the contact portion between the metal plate 292 and the lower surface of the bottom member 232, and the contact portion between the pins 302 and the gate electrode pads 224 of the semiconductor element 220 are not joined by brazing filler metal such as solder. Therefore, when the lid member 250 is removed from the cylindrical body 240, the members of the stacked body are able to be separated from each other.

Also, the semiconductor module 200 has a bus bar 260 and an insulating plate 270. The bus bar 260 is made of metal. The bus bar 260 has a structure substantially similar to that of the bus bar 60. That is, the bus bar 260 includes a ring portion 262, and an extended portion 264 that is drawn outward from the ring portion 262. Although not shown in detail in FIG. 4, eight recessed portions are formed at equally-spaced intervals in a circumferential direction of an inner peripheral surface of a central hole of the ring portion 262, on an inner surface of the central hole. The recessed portions are formed extending in the axial direction of the ring portion 262, from an upper surface to a lower surface of the ring portion 262. The cylindrical body 240 is inserted into the central hole of the ring portion 262. The protruding portions 244 of the cylindrical body 240 are engaged with the eight recessed portions of the ring portion 262. In this example embodiment, the extended portion 264 extends parallel to the extended portion 64 of the bus bar 60 and the extended portion 124 of the bus bar 120.

The insulating plate 270 is formed by an insulating body. The insulating plate 270 is formed in a ring shape. An outer diameter of the ring-shaped insulating plate 270 is larger than an outer diameter of the ring portion 262 of the bus bar 260. An inner diameter of a central hole of the insulating plate 270 is the same as the inner diameter of the central hole of the ring portion 262 of the bus bar 260. Eight recessed portions similar to the recessed portions of the bus bar 260 are also formed on an inner surface of the central hole of the insulating plate 270. These recessed portions are also formed extending in the axial direction of the ring-shaped insulating plate 270, from an upper surface to a lower surface of the insulating plate 270. The cylindrical body 240 is inserted into the central hole of the insulating plate 270. The protruding portions 244 of the cylindrical body 240 are engaged with the eight recessed portions of the insulating plate 270. In this example embodiment, the insulating plate 270 is arranged between the bus bar 260 and the bottom member 232, as shown in FIG. 4.

The lower surface of the ring portion 262 of the bus bar 260 is contacting the upper end of the side wall portion 252 of the lid member 250. The upper surface of the ring portion 262 is contacting the insulating plate 270. The ring portion 262 of the bus bar 260 and the insulating plate 270 are vertically sandwiched by the side wall portion 252 of the lid member 250, and the lower surface of the bottom member 232. As described above, the lid member 250 is fastened to the cylindrical body 240. Therefore, the ring portion 262 of the bus bar 260 and the insulating plate 270 are pressed on by the side wall portion 252 of the lid member 250, and the lower surface of the bottom member 232. The bus bar 260 and the insulating plate 270 are fixed with respect to the lid member 250 and the bottom member 232 by this pressure. Therefore, the fastening torque of the lid member 250 may be set appropriately according to the pressure necessary to fix the stacked body. As a result, the bus bar 260 is electrically connected to the lid member 250. On the other hand, the bus bar 260 is insulated from the bottom member 232 by the insulating plate 270. Accordingly, when the lid member 250 is removed from the cylindrical body 240, the bus bar 260 and the insulating plate 270 are able to be separated from the cylindrical body 240. Therefore, the engagement position of the recessed portions of the bus bar 260 and the protruding portions 244 of the cylindrical body 240 is also able to be changed. In this case, the extended portion 264 of the bus bar 260 is able to be extended in a different direction than that shown in FIG. 4. The fastening torque of the lid member 250 may be set appropriately according to the pressure necessary to fix the stacked body, the ring portion 262 of the bus bar 260, and the insulating plate 270.

The semiconductor module 200 of this example embodiment is provided with the upper layer portion 201 that includes the semiconductor element 20, and the lower layer portion 202 that includes the semiconductor element 220, with the upper layer portion 201 and the lower layer portion 202 stacked together. Also, the semiconductor element 20 and the semiconductor element 220 are connected in series by the source electrode 22 of the semiconductor element 20 being connected to the drain electrode 226 of the semiconductor element 220 via the shared bottom member 232. In this semiconductor module 200, the bus bar 60 serves as a positive electrode terminal, the bus bar 260 serves as a negative electrode terminal, and the bus bar 120 serves as an output terminal.

Figure 5:
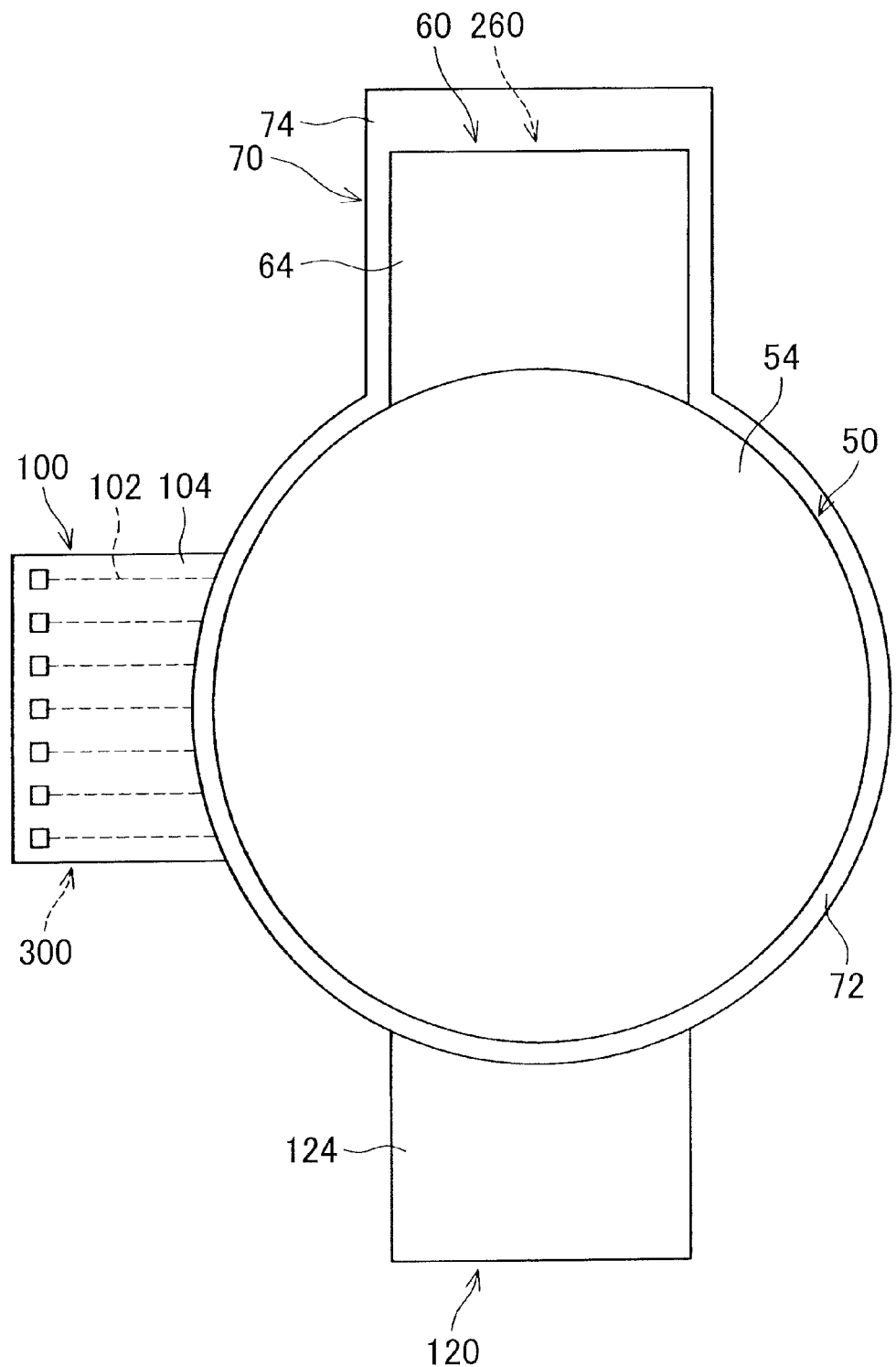
FIG. 5 is a plan view showing the manner in which a direction in which bus bars extend have been changed, in the semiconductor module according to the third example embodiment of the invention.

Further, with the semiconductor module 200 of this example embodiment, as shown in FIG. 5, the directions in which the bus bars 60, 120, and 260 extend may be changed to different directions than those shown in FIG. 4. In the example in FIG. 5, the two gate wirings 100 and 300 extend in the same direction. Also in the example in FIG. 5, the bus bar 60 that serves as a positive electrode terminal and the bus bar 260 that serves as a negative electrode terminal extend in the same direction. Therefore, in the example in FIG. 5, the bus bar 60 and the bus bar 260 are able to be wired vertically opposing each other. The bus bars 60 and 120 extend in directions rotated 90 degrees to the right in the circumferential direction of the cylindrical bodys 40 and 240 with respect to the gate wirings 100 and 300. Also, the bus bar 120 extends in a direction rotated 180 degrees in the circumferential direction of the cylindrical bodys 40 and 240, with respect to the bus bars 60 and 260. That is, the bus bar 120 extends in exactly the opposite direction as the bus bars 60 and 260. As shown in the example in FIG. 5, with the semiconductor module 200 of this example embodiment, the bus bars 60, 120, and 260 are able to be pulled out in appropriate directions according to the mounting environment.

Next, the manufacturing method of the semiconductor module 200 in FIG. 4 will be described. In the manufacturing method of the semiconductor module 200 in this example embodiment, first the upper layer portion 201 is formed, then the lower layer portion 202 is formed, and the semiconductor module 200 is completed. The method for forming the upper layer portion 201 is the same as the manufacturing method of the semiconductor module 110 of the second example embodiment.

Once the upper layer portion 201 is formed, the metal plate 292 is arranged inside of the retaining member 280 (see FIG. 4), and the retaining member 280 is inserted into the cylindrical body 240 and fixed there. Next, the module is flipped vertically such that the lower surface of the bottom member 232 in FIG. 4 faces up. Then the semiconductor element 220 is arranged inside of the cylindrical body 240 (i.e., inside of the retaining member 280). Next, the gate wiring 300 is passed through the through-hole 236 of the bottom member 232 and the through-hole 284 of the retaining member 280, and arranged inside the cylindrical body 240. At this time, each of the gate electrode pads 224 is made to contact the spring portion 302a of the corresponding pin 302. Then the metal plate 294 is arranged. At this time, the source electrode 222 is made to contact the metal plate 294.

Next, the cylindrical body 240 is passed through the central hole of the ring-shaped insulating plate 270, and the insulating plate 70 is arranged so as to contact the surface on the upper side (i.e., the lower surface in FIG. 4) of the bottom member 232. At this time, the recessed portions of the inner peripheral surface of the insulating plate 70 are engaged with the protruding portions 244 of the outer peripheral surface of the cylindrical body 240.

Next, the cylindrical body 240 is passed through the central hole of the bus bar 260, and the bus bar 260 is arranged such that the ring portion 262 of the bus bar 260 contacts the upper surface (i.e., the lower surface in FIG. 4) of the insulating plate 270. In this case as well, the recessed portions of the inner peripheral surface of the ring portion 262 of the bus bar 260 are engaged with the protruding portions 244 of the cylindrical body 240. At this time, as shown in FIG. 4, the bus bar 260 is arranged with the extended portion 264 extending toward the right in FIG. 4 (i.e., the predetermined direction), just like the extended portions 64 and 124.

Next, the lid member 250 is fixed to the cylindrical body 240 by engaging the screw groove 256 of the lid member 250 with the screw groove 242 of the cylindrical body 240. When the lid member 250 is moved downward (upward in FIG. 4) by rotating the lid member 250 around its central axis, the flat plate portion 254 of the lid member 250 contacts the metal plate 294. Also, the lower end (the upper end in FIG. 4) of the side wall portion 252 of the lid member 250 contacts the ring portion 262 of the bus bar 260. When the lid member 250 is rotated from there, the flat plate portion 254 of the lid member 250 presses the metal plate 294 toward the semiconductor element 220. That is, the stacked body (i.e., the metal plate 294, the semiconductor element 220, and the metal plate 292) sandwiched by the flat plate portion 254 of the lid member 250 and the bottom member 232 is pressed in the stacking direction thereof. As a result, the members of the stacked body are fixed with respect to the bottom member 232 and the lid member 250.

At the same time, the side wall portion 252 of the lid member 250 presses the ring portion 262 of the bus bar 260 and the insulating plate 270 toward the bottom member 232. That is, the ring portion 262 and the insulating plate 270 that are sandwiched between the side wall portion 252 and the bottom member 232 are pressed on. As a result, the bus bar 260 and the insulating plate 270 are fixed with respect to the bottom member 232 and the lid member 250. Accordingly, the bus bar 260 is electrically connected to the lid member 250, while being electrically insulated from the bottom member 232.

Also at this time, the source electrode 222 is electrically connected to the lid member 250 by plastic deformation of the metal plate 294. Also, the drain electrode 226 is electrically connected to the bottom member 232 by plastic deformation of the metal plate 292.

Also, when the stacked body is pressed on, the spring portions 302a of the pins 302 deform. As a result, suitable pressure is applied between the pins 302 and the gate electrode pads 224, such that the pins 302 are reliably electrically connected to the gate electrode pads 224. As a result, the lower layer portion 202 is formed. Then the semiconductor module 200 shown in FIG. 4 is complete when the module is vertically flipped again such that the lower surface of the bottom member 232 in FIG. 4 faces down.

Heretofore, the structure and manufacturing method of the semiconductor module 200 according to this example embodiment are described. The semiconductor module 200 of this example embodiment is also able to display the same effects as those displayed by the semiconductor modules 10 and 110 of the first and second example embodiments. Furthermore, the semiconductor module 200 of this example embodiment includes the upper layer portion 201 having the semiconductor element 20, and the lower layer portion 202 having the semiconductor element 220, with the upper layer portion 201 and the lower layer portion 202 being stacked together. Therefore, in the semiconductor module 200 of this example embodiment, the two semiconductor elements 20 and 220 are provided connected in series and stacked together inside a single semiconductor module.

Also, the semiconductor element 20 is one example of a first semiconductor element, and the semiconductor element 220 is one example of a second semiconductor element. The cylindrical body 40 is one example of a first cylindrical body and the cylindrical body 240 is one example of a second cylindrical body. The bus bar 60 is one example of a first conducting member, the bus bar 120 is one example of a second conducting member, and the bus bar 260 is one example of a third conducting member. The bottom member 232 is one example of a first bottom member, and the lid member 250 is one example of a second bottom member. The insulating plate 70 is one example of a first insulating member, and the insulating plate 270 is one example of a second insulating member. A central hole of the bus bar 60 is one example of a first through-hole, and a central hole of the bus bar 120 is one example of a second through-hole. The protruding portions 44 of the cylindrical body 40 are one example of a first protruding portion, and the recessed portions 68 of the bus bar 60 are one example of a first recessed portion. The protruding portions 44 of the cylindrical body 40 are one example of a second protruding portion, and the recessed portions of the bus bar 120 are one example of a second recessed portion.

Fourth Example Embodiment

Figure 6:
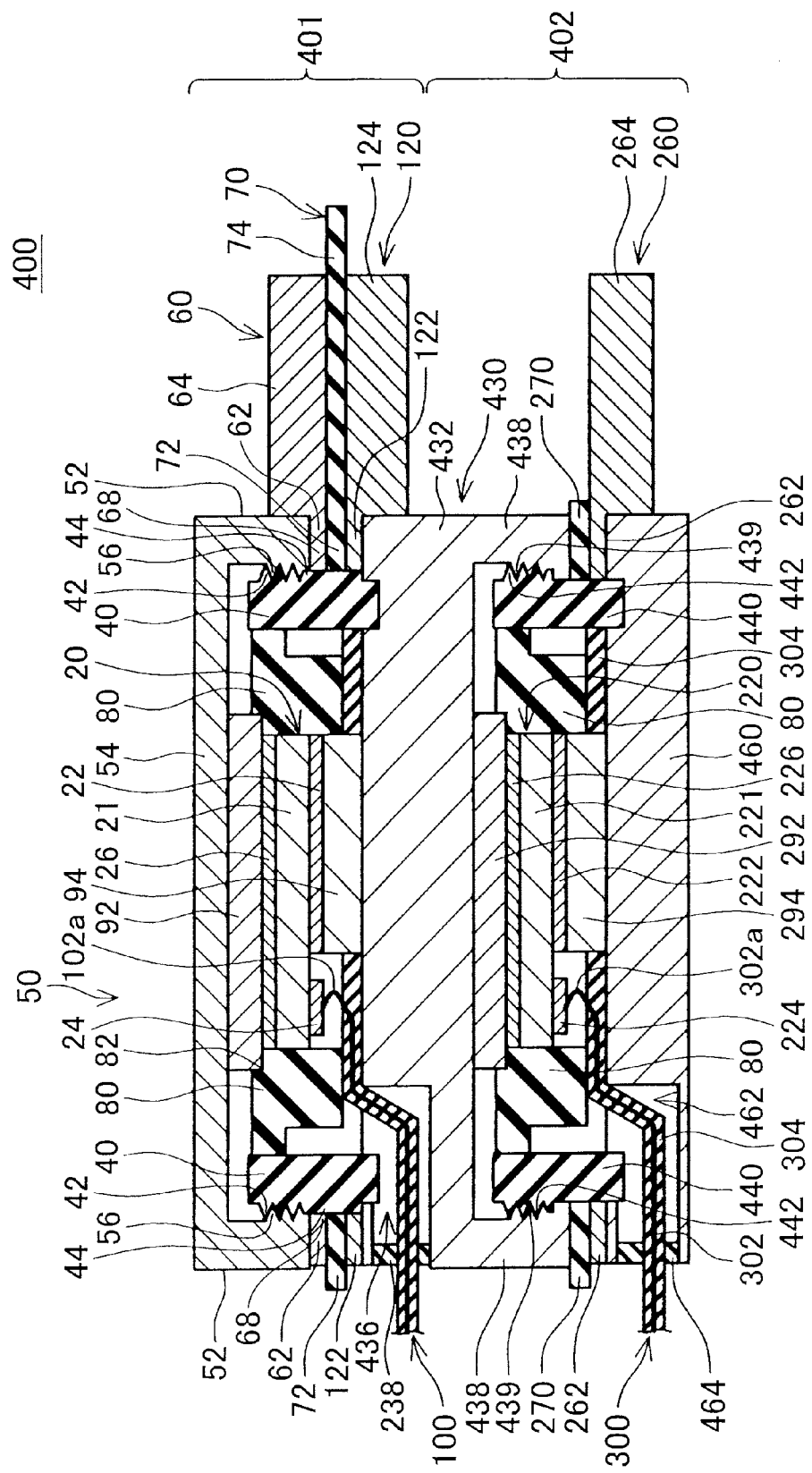
FIG. 6 is a sectional view schematically showing a semiconductor module according to a fourth example embodiment of the invention.

Next, a semiconductor module 400 according to a fourth example embodiment, as well as a manufacturing method thereof, will be described with reference to FIG. 6, focusing mainly on those points that differ from the example embodiments described above. As shown in FIG. 6, the semiconductor module 400 of this example embodiment also has an upper layer portion 401 that includes a semiconductor element 20, and a lower layer portion 402 that includes a semiconductor element 220, similar to the third example embodiment. The semiconductor module 400 of this example embodiment also has a structure that connects the semiconductor element 20 with the semiconductor element 220 in series. The upper layer portion 401 has substantially the same structure as the semiconductor module 110 of the second example embodiment (see FIG. 3). However, the structure of a bottom member 432 in this example embodiment differs from the second example embodiment.

As shown in FIG. 6, the bottom member 432 is made of metal and is formed in a disc shape. A cylindrical body 40 is fixed to an upper surface of the bottom member 432. Also, a through-hole 436 is provided in the bottom member 432, with the through-hole 436 opening to an upper surface and a side surface of the bottom member 432. A gate wiring 100 passes through the through-hole 436. Also, the bottom member 432 has a round cylindrical shaped side wall portion 438 on a lower side surface. That is, the lower surface side of the bottom member 432 has a cup shape. A screw groove 439 is formed on an inner peripheral surface of the side wall portion 438. The screw groove 439 engages with a screw groove 442 of a cylindrical body 440 that will be described later. That is, the bottom member 432 engages with the cylindrical body 440, using the screw grooves 439 and 442.

In this example embodiment, the upper layer portion 401 and the lower layer portion 402 share the bottom member 432 described above. As shown in FIG. 6, the lower layer portion 402 includes the semiconductor element 220, the bottom member 432, a lid member 460, a cylindrical body 440, a bus bar 260, an insulating plate 270, a retaining member 80, metal plates 292 and 294, and a gate wiring 300.

The semiconductor element 220, the metal plates 292 and 294, and the gate wiring 300 have structures similar to those of the members in the third example embodiment described above (see FIG. 4). Also, the retaining member 80 also has a structure similar to that of the retaining member 80 of the upper layer portion 401.

The lid member 460 has a structure similar to that of the bottom member 132 in the second example embodiment (see FIG. 3). That is, the lid member 460 is formed in a disc shape, and the cylindrical body 440 is fixed to the upper surface. Also, a through-hole 462 is formed in the lid member 460, with one end of the through-hole 462 opening to an upper surface of the lid member 460, and the other end of the through-hole 462 opening to a side surface of the lid member 460. The gate wiring 300 is fixed by an insulating member 464 at an open portion of the through-hole 462.

The cylindrical body 440 has a structure substantially similar to that of the cylindrical body 40. A lower end portion of the cylindrical body 440 is fixed embedded in the upper surface of the lid member 460. The screw groove 442 is formed in an outer peripheral surface near an upper end portion of the cylindrical body 440. As described above, the screw groove 442 is engaged with the screw groove 439 of the bottom member 432. Also, the cylindrical body 440 of this example embodiment differs from the cylindrical body 40 in that protruding portions are not provided below the screw groove 442.

The metal plate 294, the semiconductor element 220, the metal plate 292, the retaining member 80, and an end portion of the gate wiring 300 are arranged on the upper surface of the lid member 460, inside the cylindrical body 440. In this example embodiment, a stacked body formed by the metal plate 294, the semiconductor element 220, and the metal plate 292 is sandwiched by the upper surface of the lid member 460 to which the cylindrical body 440 is fixed, and the lower surface of the bottom member 432.

The bus bar 260 has a structure substantially similar to that of the bus bar 260 of the third example embodiment (see FIG. 4). However, the bus bar 260 in this example embodiment differs from the bus bar 260 in the third example embodiment in that recessed portions are not formed on the inner surface of the central hole of the ring portion 262. The lower surface of the ring portion 262 of the bus bar 260 contacts the upper surface of the lid member 460. The insulating plate 270 also has a structure substantially similar to that of the insulating plate 270 in the third example embodiment (see FIG. 4). However, the insulating plate 270 in this example embodiment differs from the insulating plate 270 in the third example embodiment in that recessed portions are not formed on the inner surface of the central hole of the ring-shaped insulating plate 270. The insulating plate 270 is arranged between the bus bar 260 and the lid member 460.

The ring portion 262 of the bus bar 260, and the insulating plate 270, are vertically sandwiched by the lower end of the side wall portion 438 of the bottom member 432, and the upper surface of the lid member 460. As described above, the bottom member 432 is fastened to the cylindrical body 440. Therefore, the ring portion 262 of the bus bar 260 and the insulating plate 270 are pressed on by the side wall portion 438 of the bottom member 432, and the upper surface of the lid member 460. The bus bar 260 and the insulating plate 270 are fixed with respect to the bottom member 432 and the lid member 460 by this pressure. As a result, the bus bar 260 is electrically connected to the lid member 460, and insulated from the bottom member 432. Accordingly, when the bottom member 432 is removed from the cylindrical body 440, the bus bar 260 and the insulating plate 270 are able to be separated from the cylindrical body 440. Therefore, in this example embodiment, the cylindrical body 440 is not provided with protruding portions, and the bus bar 260 is not provided with recessed portions, so the extending direction of the extended portion 264 of the bus bar 260 is able to be set to an appropriate direction in the circumferential direction of the cylindrical body 440.

The semiconductor module 400 of this example embodiment also includes an upper layer portion 401 having a semiconductor element 20, and a lower layer portion 402 having a semiconductor element 220, with the upper layer portion 401 and the lower layer portion 402 arranged stacked together. Also, the semiconductor element 20 is connected in series to the semiconductor element 220 by the source electrode 22 of the semiconductor element 20 and the drain electrode 226 of the semiconductor element 220 being connected together via a shared bottom member 432. In this semiconductor module 400 as well, the bus bar 60 serves as a positive electrode terminal, the bus bar 260 serves as a negative electrode terminal, and the bus bar 120 serves as an output terminal.

Next, a manufacturing method of the semiconductor module 400 in FIG. 6 will be described. In the manufacturing method of the semiconductor module 400 in this example embodiment, first the upper layer portion 401 is formed, then the lower layer portion 402 is formed, and then the semiconductor module 400 is completed. The method for forming the upper layer portion 401 is the same as the manufacturing method of the semiconductor module 110 of the second example embodiment (see FIG. 3).

Once the upper layer portion 401 is formed, then the lid member 460 to which the cylindrical body 440 is fixed to the upper surface is prepared, and the metal plate 294, the semiconductor element 220, the metal plate 292, the gate wiring 300, and the retaining member 80 are arranged, similar to when forming the upper layer portion 401, on the upper surface of the lid member 460 inside the cylindrical body 440.

Next, the cylindrical body 440 is passed through the central hole of the bus bar 260, and the ring portion 262 of the bus bar 260 is arranged on the lid member 460. Further, the cylindrical body 440 is passed through the central hole of the ring-shaped insulating plate 270, and the insulating plate 270 is arranged on the ring portion 262 of the bus bar 260.

Then, the bottom member 432 is fixed to the cylindrical body 440 by engaging the screw groove 439 of the bottom member 432 with the screw groove 442 of the cylindrical body 440. When the bottom member 432 is moved downward by rotating the bottom member 432 around its central axis, the lower surface of the bottom member 432 contacts the metal plate 292. Also, the lower end of the side wall portion 438 of the bottom member 432 contacts the insulating plate 270. When the bottom member 432 is rotated from there, the stacked body (i.e., the metal plate 294, the semiconductor element 220, and the metal plate 292) sandwiched by the lower surface of the bottom member 432 and the upper surface of the lid member 460 is pressed in the stacking direction thereof. As a result, the members of the stacked body are fixed with respect to the lid member 460 and the bottom member 432.

At the same time, the side wall portion 438 of the bottom member 432 presses the insulating plate 270 and the ring portion 262 of the bus bar 260 toward the lid member 460. That is, the insulating plate 270 and the ring portion 262 that are sandwiched between the side wall portion 438 and the lid member 460 are pressed on. As described above, in this example embodiment, no recessed portions are provided on the bus bar 260 and no protruding portions are provided on the cylindrical body 440. Therefore, the bus bar 60 will end up rotating as the bottom member 432 rotates when the bottom member 432 is fastened to the cylindrical body 440. Therefore, in this example embodiment, before completely fastening the bottom member 432 and the cylindrical body 440 together, the extended portion 264 of the bus bar 260 is adjusted to extend in the same direction as the extended portions 64 and 124 by rotating the ring portion 262 of the bus bar 260 left and right along the outer peripheral surface of the cylindrical body 440. When the bottom member 432 and the cylindrical body 440 are completely fastened together, the bus bar 260 and the insulating plate 270 are fixed with respect to the bottom member 432 and the lid member 460. As a result, the bus bar 260 is electrically connected to the lid member 460, but insulated from the bottom member 432.

Also, the source electrode 222 is electrically connected to the lid member 460 by plastic deformation of the metal plate 294. Also, the drain electrode 226 is electrically connected to the bottom member 432 by plastic deformation of the metal plate 292.

Further, when the stacked body is pressed on, the spring portions 302a of the pins 302 deform. As a result, suitable pressure is applied between the pins 302 and the gate electrode pads 224, such that the pins 302 are reliably electrically connected to the gate electrode pads 224. The fastening torque of the bottom member 432 may be appropriately set according to the pressure necessary to fix the stacked body, the ring portion 262 of the bus bar 260, and the insulating plate 270. As a result, the lower layer portion 402 is formed, thus completing the semiconductor module 400 shown in FIG. 6.

Heretofore, the structure and manufacturing method of the semiconductor module 400 according to this example embodiment are described. The semiconductor module 400 of this example embodiment is also able to display the same effects as those displayed by the semiconductor modules 10 and 110 of the first and second example embodiments. Furthermore, the semiconductor module 400 of this example embodiment also includes the upper layer portion 401 having the semiconductor element 20, and the lower layer portion 402 having the semiconductor element 220, with the upper layer portion 401 and the lower layer portion 402 being stacked together. Therefore, in the semiconductor module 400 of this example embodiment as well, the two semiconductor elements 20 and 220 are provided connected in series and stacked together inside a single semiconductor module.

Also, the semiconductor element 20 is one example of a first semiconductor element, and the semiconductor element 220 is one example of a second semiconductor element. The cylindrical body 40 is one example of a first cylindrical body and the cylindrical body 440 is one example of a second cylindrical body. The bus bar 60 is one example of a first conducting member, the bus bar 120 is one example of a second conducting member, and the bus bar 260 is one example of a third conducting member. The bottom member 432 is one example of a first bottom member, and the lid member 460 is one example of a second bottom member. The insulating plate 70 is one example of a first insulating member, and the insulating plate 270 is one example of a second insulating member. A central hole of the bus bar 60 is one example of a first through-hole, and a central hole of the bus bar 120 is one example of a second through-hole. The protruding portions 44 of the cylindrical body 40 are one example of a first protruding portion, and the recessed portions 68 of the bus bar 60 are one example of a first recessed portion. The protruding portions 44 of the cylindrical body 40 are one example of a second protruding portion, and the recessed portions of the bus bar 120 are one example of a second recessed portion.

Fifth Example Embodiment

Figure 7:
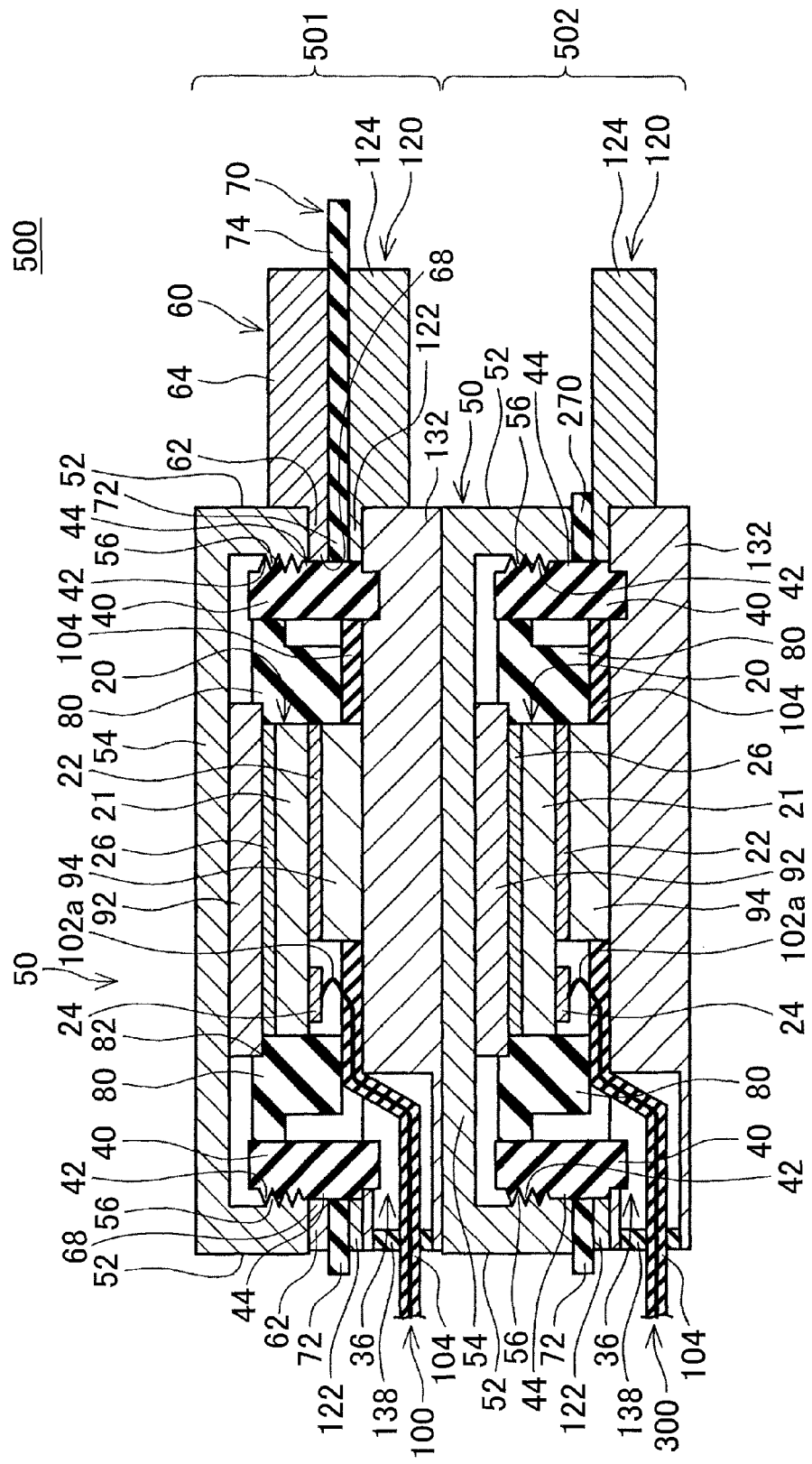
FIG. 7 is a sectional view schematically showing a semiconductor module according to a fifth example embodiment of the invention.

Next, a semiconductor module 500 according to a fifth example embodiment, as well as a manufacturing method thereof, will be described with reference to FIG. 7, focusing mainly on those points that differ from the example embodiments described above. As shown in FIG. 7, the semiconductor module 500 of this example embodiment also has an upper layer portion 501 and a lower layer portion 502, similar to the third and fourth example embodiments described above. The upper layer portion 501 has a structure similar to that of the semiconductor module 110 of the second example embodiment (see FIG. 3). Also, the lower layer portion 502 also has a structure substantially similar to that of the upper layer portion 501. However, the lower layer portion 502 differs from the upper layer portion 501 in that it (i.e., the lower layer portion 502) is not provided with a bus bar 60, and is provided with an insulating plate 270 instead of the insulating plate 70. The insulating plate 270 is similar to the insulating plate 270 in the third example embodiment (see FIG. 4). In FIG. 7, members of the upper layer portion 501 and the lower layer portion 502 having similar structures will be denoted by like reference characters.

A bottom member 132 of the upper layer portion 501 and a lid member 50 of the lower layer portion 502 are electrically joined not via brazing filler metal such as solder. The bottom member 132 of the upper layer portion 501 and the lid member 50 of the lower layer portion 502 may be joined by clamping the upper layer portion 501 and the lower layer portion 502 from above and below by a clamp device, not shown. As a result, the source electrode 22 of the semiconductor element 20 of the upper layer portion 501 is electrically connected to the drain electrode 26 of the semiconductor element 20 of the lower layer portion 502. Accordingly, with the semiconductor module 500 of this example embodiment, the semiconductor element 20 of the upper layer portion 501 is connected in series to the semiconductor element 20 of the lower layer portion 502. With this semiconductor module 500 as well, the bus bar 60 of the upper layer portion 501 serves as a positive electrode terminal, the bus bar 120 of the lower layer portion 502 serves as a negative electrode terminal, and the bus bar 120 of the upper layer portion 501 serves as an output terminal.

Next, a manufacturing method of the semiconductor module 500 in FIG. 7 will be described. In this example embodiment, the upper layer portion 501 and the lower layer portion 502 are formed individually, and then the semiconductor module 500 in FIG. 7 is completed by stacking the bottom member 132 of the upper layer portion 501 on the lid member 50 of the lower layer portion 502 and joining them together. The method for forming both the upper layer portion 501 and the lower layer portion 502 is the same as the manufacturing method of the semiconductor module 110 of the second example embodiment (see FIG. 3).

Heretofore, the structure and manufacturing method of the semiconductor module 500 according to this example embodiment are described. The semiconductor module 500 of this example embodiment is also able to display the same effects as those displayed by the semiconductor modules 10 and 110 of the first and second example embodiments. Furthermore, the semiconductor module 500 of this example embodiment also includes the upper layer portion 501 and the lower layer portion 502 stacked together. Therefore, in the semiconductor module 500 of this example embodiment as well, the two semiconductor elements are provided connected in series and stacked together inside a single semiconductor module.

Also, the semiconductor element 20 of the upper layer portion 501 is one example of a first semiconductor element, and the semiconductor element 20 of the lower layer portion 502 is one example of a second semiconductor element. The cylindrical body 40 of the upper layer portion 501 is one example of a first cylindrical body and the cylindrical body 40 of the lower layer portion 502 is one example of a second cylindrical body. The bus bar 60 is one example of a first conducting member, the bus bar 120 of the upper layer portion 501 is one example of a second conducting member, and the bus bar 260 of the lower layer portion 502 is one example of a third conducting member. The bottom member 132 of the upper layer portion 501 is one example of a first bottom member, and the bottom member 132 of the lower layer portion 502 is one example of a second bottom member. The insulating plate 70 is one example of a first insulating member, and the insulating plate 270 is one example of a second insulating member.

While various example embodiments of the invention have been described in detail, these example embodiments are merely examples for carrying out the invention. Thus, the invention is not limited to these example embodiments. To the contrary, various modifications and variations are also possible within the scope of the claims.

First Modified Example

In the second example embodiment described above, the bus bar 60 and the bus bar 120 are insulated by providing the insulating plate 70 between the bus bar 60 and the bus bar 120 (see FIG. 3). In this case, the insulating plate 70 is formed thick enough to reliably insulate the bus bar 60 and the case member 30. Instead of this, for example, a flange portion made of insulating material may be formed on the outer peripheral surface of the cylindrical body 40, and the ring portion 122 of the bus bar 120 may be arranged on the outer periphery of this flange portion. In this case, the ring portion 72 of the insulating plate 70 is arranged on this flange portion, and the ring portion 62 of the bus bar 60 is arranged on the ring portion 72 of the insulating plate 70. By providing the flange portion, sufficient distance (so-called insulation creepage distance) is able to be easily ensured between the inner peripheral surface of the ring portion 122 of the bus bar 120, and the inner peripheral surface of the ring portion 62 of the bus bar 60. Therefore, even if the insulating plate 70 is formed thin, the bus bar 60 and the bus bar 120 are still able to be insulated.

Also, an insulating region may be formed on the inner peripheral surface of the ring portion 122 of the bus bar 120. In this case, the ring portion 72 of the insulating plate 70 is arranged on the insulating region, and the ring portion 62 of the bus bar 60 is arranged on the ring portion 72 of the insulating plate 70. By providing the insulating region on the inner peripheral surface of the ring portion 122 of the bus bar 120, sufficient distance (so-called insulation creepage distance) is able to be easily ensured between the inner peripheral surface of the ring portion 62 of the bus bar 60, and the bus bar 120. Therefore, in this case as well, even if the insulating plate 70 is formed thin, the bus bar 60 and the bus bar 120 are still able to be insulated. This modified example may also be applied to the other example embodiments.

Second Modified Example

In the first example embodiment, the cylindrical body 40 has eight protruding portions 44, and the bus bar 60 has eight recessed portions 68, as shown in FIG. 2. The structure for positioning the cylindrical body 40 and the bus bar 60 is not limited to this. Therefore, for example, the cylindrical body 40 may have only one protruding portion 44, and the bus bar 60 may have eight recessed portions 68. In this case, the cylindrical body 40 and the bus bar 60 are positioned by engaging one of the eight recessed portions of the bus bar 60 with the one protruding portion of the cylindrical body 40. Also, the number of protruding portions of the cylindrical body 40, and the number of recessed portions of the bus bar 60, are not limited to eight as shown in FIG. 2, but may be fewer than eight or greater than eight. Also, the recessed portion 68 may be formed in an outer surface of cylindrical body 40. In this case, the protruding portion 44 may be formed on an inner surface of the central hole of the bus bars 60, 120, and 260 and/or the insulating plate 70.

Third Modified Example

In the first example embodiment described above, the protruding portions 44 do not have to be formed on the cylindrical body 40. Also, the recessed portions 68 do not have to be formed on the bus bar 60 either. With this structure, the direction in which the extended portion 64 of the bus bar 60 extends may be set to an appropriate direction in the circumferential direction of the outer peripheral surface of the cylindrical body 40.

Fourth Modified Example

In the example embodiments described above, vertical MOSFETs are used as the semiconductor elements. The semiconductor elements are not limited to these. That is, other vertical semiconductor elements such as vertical IGBTs may also be used. Also, in the example embodiments described above, gate wirings are used as the signal wires of the semiconductor elements. The signal wires of the semiconductor elements are not limited to gate wirings. That is, other signal wires (such as signal wires used for sensing the temperature) may also be used.

Fifth Modified Example

In the example embodiments described above, the screw groove 42 is formed in an outer peripheral surface of cylindrical body 40. The screw groove 42 is not limited to these. That is, the screw groove may be formed in an inner peripheral surface of cylindrical body 40.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A semiconductor module comprising:
    a first semiconductor element that has a first front surface electrode on a front surface and has a first back surface electrode on a back surface;
    a first bottom member that is contacting the first back surface electrode;
    a first cylindrical body that is formed by an insulating body, is formed in a cylindrical shape, surrounds the first semiconductor element, is fixed to the first bottom member, and in which a first screw groove is formed on an outer peripheral surface or an inner peripheral surface;
    a lid member that is formed by an electric conductor, is contacting the first front surface electrode, and has a second screw groove that engages with the first screw groove;
    a first conducting member that is formed by an electric conductor, has a first through-hole into which the first cylindrical body is inserted and a first extended portion that extends outward from an outer peripheral surface of the first cylindrical body, is provided outside of the first cylindrical body, and is contacting the lid member;
    a second conducting member that is formed by an electric conductor, is provided outside of the first cylindrical body, and is contacting the first bottom member; and
    a first insulating member that insulates between the first conducting member and the second conducting member,
    wherein the lid member is fixed to the first cylindrical body by engagement of the second screw groove with the first screw groove; the first conducting member is fixed with respect to the lid member and the first bottom member, by being sandwiched between the lid member and the first bottom member that are fixed to the first cylindrical body; the first semiconductor element is fixed with respect to the lid member and the first bottom member, by being sandwiched between the lid member and the first bottom member; a first protruding portion is formed on one of the outer peripheral surface of the first cylindrical body and an inner surface of the first through-hole, a first recessed portion that is able to engage with the first protruding portion is formed on the other of the outer peripheral surface of the first cylindrical body and the inner surface of the first through-hole, and when the first cylindrical body is inserted into the first through-hole, the first protruding portion and the first recessed portion engage, such that the first conducting member is positioned with respect to the first cylindrical body; a plurality of positioning positions of the first conducting member with respect to the first cylindrical body are provided in a circumferential direction by the first protruding portion being formed in at least one location in the circumferential direction, and the first recessed portion being formed in a plurality of locations in the circumferential direction; and the first extended portion extends in one direction, for among a plurality of directions in the circumferential direction of the first cylindrical body, corresponding to the plurality of positioning positions of the first conducting member.

2. The semiconductor module according to claim 1, wherein the second conducting member has a second through-hole into which the first cylindrical body is inserted, and a second extended portion that extends outward from the outer peripheral surface of the first cylindrical body; a second protruding portion is formed on one of the outer peripheral surface of the first cylindrical body and an inner surface of the second through-hole, and a second recessed portion that is able to engage with the second protruding portion is formed on the other of the outer peripheral surface of the first cylindrical body and the inner surface of the second through-hole; when the first cylindrical body is inserted into the second through-hole, the second protruding portion and the second recessed portion engage, such that the second conducting member is positioned with respect to the first cylindrical body; a plurality of positioning positions of the second conducting member with respect to the first cylindrical body are provided in a circumferential direction by the second protruding portion being formed in at least one location in the circumferential direction, and the second recessed portion being formed in a plurality of locations in the circumferential direction; and the second extended portion extends in one direction, for among a plurality of directions in the circumferential direction of the first cylindrical body, corresponding to the plurality of positioning positions of the second conducting member.

3. The semiconductor module according to claim 1, further comprising:
    a second semiconductor element that has a second front surface electrode on a front surface and has a second back surface electrode on a back surface;
    a second bottom member that is contacting the second back surface electrode;
    a second cylindrical body that is formed by an insulating body, surrounds the second semiconductor element, and is fixed to one of the second bottom member and the first bottom member;
    a third conducting member that is formed by an electric conductor, is provided outside of the second cylindrical body, and is contacting the second bottom member; and
    a second insulating member that insulates between the third conducting member and the first bottom member,
    wherein the second front surface electrode is contacting a surface of the first bottom member, which is on a side opposite a surface that is contacting the first back surface electrode; the third conducting member is fixed with respect to the first bottom member and the second bottom member, by being sandwiched between the first bottom member and the second bottom member; and the second semiconductor element is fixed with respect to the first bottom member and the second bottom member, by being sandwiched between the first bottom member and the second bottom member.

4. The semiconductor module according to claim 1, wherein the second conducting member is fixed with respect to the lid member and the first bottom member, by being sandwiched between the lid member and the first bottom member that are fixed to the first cylindrical body.

* * * * *